United States Patent [19]
Nakayama et al.

[11] Patent Number: 5,676,869
[45] Date of Patent: Oct. 14, 1997

[54] VERTICAL HEAT TREATMENT APPARATUS

[75] Inventors: Junichi Nakayama; Masaru Hidano, both of Kanagawa-Ken, Japan

[73] Assignee: Tokyo Electron Limited, Tokyo-to, Japan

[21] Appl. No.: 552,587

[22] Filed: Nov. 3, 1995

[30] Foreign Application Priority Data

Nov. 7, 1994 [JP] Japan .................................. 6-297947

[51] Int. Cl.⁶ .................................................. F27D 19/00
[52] U.S. Cl. ........................... 219/390; 219/413; 373/136; 118/725
[58] Field of Search .................................. 219/390, 405, 219/411, 412, 413, 449, 494; 392/416, 418; 118/50.1, 724, 725; 373/136

[56] References Cited

U.S. PATENT DOCUMENTS

| | | | |
|---|---|---|---|
| 4,061,870 | 12/1977 | Mizushima | 373/136 |
| 4,123,989 | 11/1978 | Jewett | 118/724 |
| 4,348,580 | 9/1982 | Drexel | 219/390 |
| 5,125,359 | 6/1992 | Barale et al. | 118/725 |
| 5,128,515 | 7/1992 | Tanaka | 219/390 |
| 5,171,972 | 12/1992 | Hidano | 219/390 |

FOREIGN PATENT DOCUMENTS

| | | |
|---|---|---|
| 55-89464 | 7/1980 | Japan . |
| 4-144133 | 5/1992 | Japan . |
| 6-37025 | 2/1994 | Japan . |
| 6-192840 | 7/1994 | Japan . |
| 6-326046 | 11/1994 | Japan . |

Primary Examiner—Teresa J. Walberg
Assistant Examiner—J. Pelham
Attorney, Agent, or Firm—Beveridge, DeGrandi, Weilacher & Young, LLP

[57] ABSTRACT

A vertical heat treatment apparatus is provided with a cylindrical insulating layer surrounding the periphery of a vertical processing chamber accommodating objects to be subjected to thermal processing and a resistance heating member provided along the inner periphery of the insulating layer. To control the temperature of the resistance heating member, a temperature measuring element having a thermocouple in a tip portion of an insulated protective tube is inserted at an angle from the outside of the insulating layer and a tip portion of the temperature measuring element is aligned with the resistance heating member. This reduces the temperature error between the resistance heating member and the temperature measuring element and also greatly improves the response rate and reproducibility of temperature measurement, thus facilitating temperature management in the vertical heat treatment apparatus.

19 Claims, 5 Drawing Sheets

VERTICAL HEAT TREATMENT APPARATUS

BACKGROUND OF THE INVENTION

The present invention relates to a vertical heat treatment apparatus.

Various types of heat treatment apparatus are currently used in the fabrication of semiconductor devices, for example, to perform processes such as oxidation, diffusion, and chemical vapor deposition (CVD). One of these is a vertical heat treatment apparatus that was developed as an apparatus that enables batch processing and has a reduced installation space. This apparatus is provided with a vertical process tube for the thermal processing of semiconductor wafers which are objects to be processed and which are accommodated therein.

Figure 7:
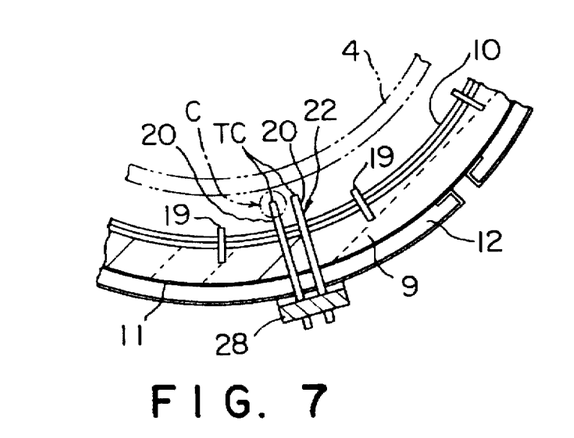
FIG. 7 is an expanded cross-sectional view of a portion through which a temperature measuring element of a vertical heat treatment apparatus of the prior art is inserted.
Figure 8A:
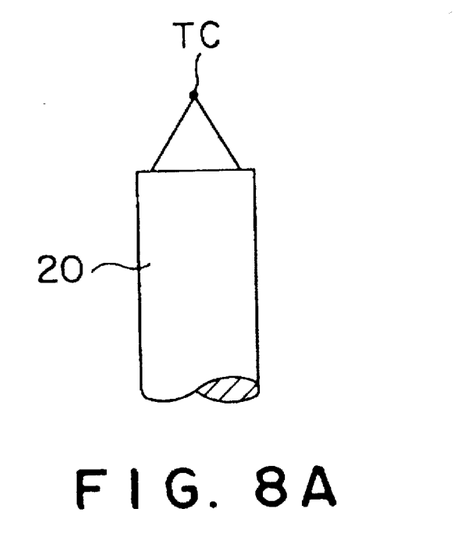
FIGS. 8A to 8D are partial expanded plan views of thermocouple portions of temperature measuring elements of the prior art.
Figure 8B:
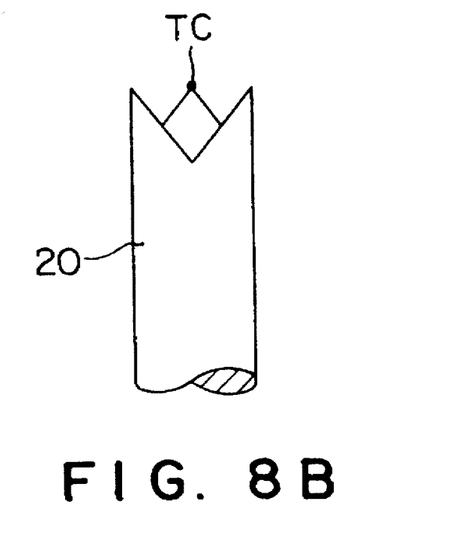
Figure 8C:
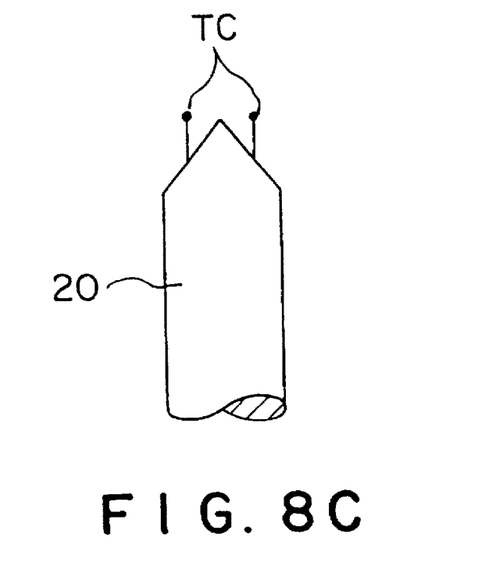
Figure 8D:
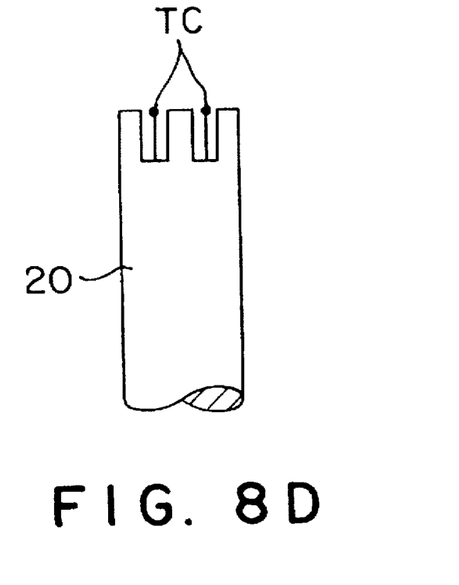

As shown in FIG. 7, a cylindrical insulating layer 9 is provided around such a process tube 4 and a resistance heating member (heater) 10 is provided within this insulating layer 9, formed in, for example, a spiral shape along the inner periphery thereof on support members 19 such as support bricks. The outer periphery of the insulating layer 9 is covered by an outer shell 11 formed of a material such as stainless steel, and a cooling jacket 12 in which is accommodated cooling coils (not shown) is provided around the outer periphery of the outer shell 11.

In order to manage the temperature of the resistance heater 10, a temperature measuring element 22 having any of various types of thermocouple TC at the tip of an electrically insulated protective tube 20 thereof (see FIGS. 8A to 8D) is inserted from the outer side of the outer shell 11 in the radial direction, that is, toward the core of the furnace. A base end portion of the temperature measuring element 22 is fixed to the outer wall of the control section 12 by a holder member 28 made of a material such as aluminum, with the tip portion of the temperature measuring element 22 protruding from the insulating layer 9 past the resistance heater 10 toward the core, but within a range in which it does not interfere with the process tube 4.

However, in this prior-art vertical heat treatment apparatus, the attachment mechanism of the resistance heater causes a certain amount of error between the temperature measured (detected) by the temperature measuring element and the actual temperature of the resistance heater, which causes problems in that it is not possible to obtain an accurate response rate and reproducibility in the temperature measurement, and it is difficult to control the temperature. Various reasons for these problems have been considered, including the fact that the tip portion of the temperature measuring element is positioned at some distance from the resistance heating member, the fact that the temperature measuring element is thermally insulated by the insulating layer over only a narrow range, the fact that the temperature measuring element is passed through the cooling jacket which increases the heat radiated from that portion, and the fact that heat is radiated from the holder member of the temperature measuring element which is made of a metal and thus has a high thermal conductivity. There are also problems concerning the fabrication and attachment of the thermocouple.

SUMMARY OF THE INVENTION

The present invention was devised in the light of the above described problems and has as its objective the provision of a vertical heat treatment apparatus intended to reduce the temperature error between the resistance heating member and the temperature measuring element, and also improve the response and reproducibility of temperature measurement, thus facilitating temperature management.

In order to achieve the above objective, the vertical heat treatment apparatus of the present invention is provided with a cylindrical insulating layer surrounding the periphery of a vertical processing chamber accommodating objects to be subjected to thermal processing, and a resistance heating member provided along the inner periphery of the insulating layer. In order to control the temperature of the resistance heating member, this vertical heat treatment apparatus is further provided with a temperature measuring element having a thermocouple in a tip portion of an insulated protective tube, wherein the temperature measuring element is inserted at an angle from the outside of the insulating layer and a tip portion of the temperature measuring element is aligned with the resistance heating member or placed in contact therewith.

The vertical heat treatment apparatus of this invention could also be configured in such a manner that an opening portion is formed in an outer shell covering the outer periphery of the insulating layer and an arch-shaped guide member filled with a thermal insulating material is provided to cover the opening portion, and wherein a base portion of the temperature measuring element is provided in the guide member with a plastic holder member therebetween in such a manner that the angle of insertion thereof can be freely adjusted.

Since the temperature measuring element, which has a thermocouple in a tip portion of an insulated protective tube, of the vertical heat treatment apparatus of this invention is inserted through the insulating layer from the outside and the tip portion of the temperature measuring element is either aligned with the resistance heating member or is placed in contact therewith, it is possible to suppress the heat radiated from the temperature measuring element and also reduce any temperature error between the resistance heating member and the temperature measuring element. This is intended to improve the measurement precision of the temperature measuring element as well as improve the response rate and reproducibility thereof, thus facilitating temperature management in the vertical heat treatment apparatus.

Since the vertical heat treatment apparatus of this invention is configured in such a manner that an opening portion is formed in an outer shell covering the outer periphery of the insulating layer and an arch-shaped guide member filled with a thermal insulating material is provided to cover the opening portion, and since the guide member is provided in such a manner that the angle of the base portion of the temperature measuring element can be freely adjusted via the plastic holder member, the heat radiated from the temperature measuring element can be further suppressed and also it is easy to adjust the angle of the temperature measuring element when it is positioned to be aligned with or in contact with the resistance heating member.

DESCRIPTION OF THE PREFERRED EMBODIMENTS

Figure 1:
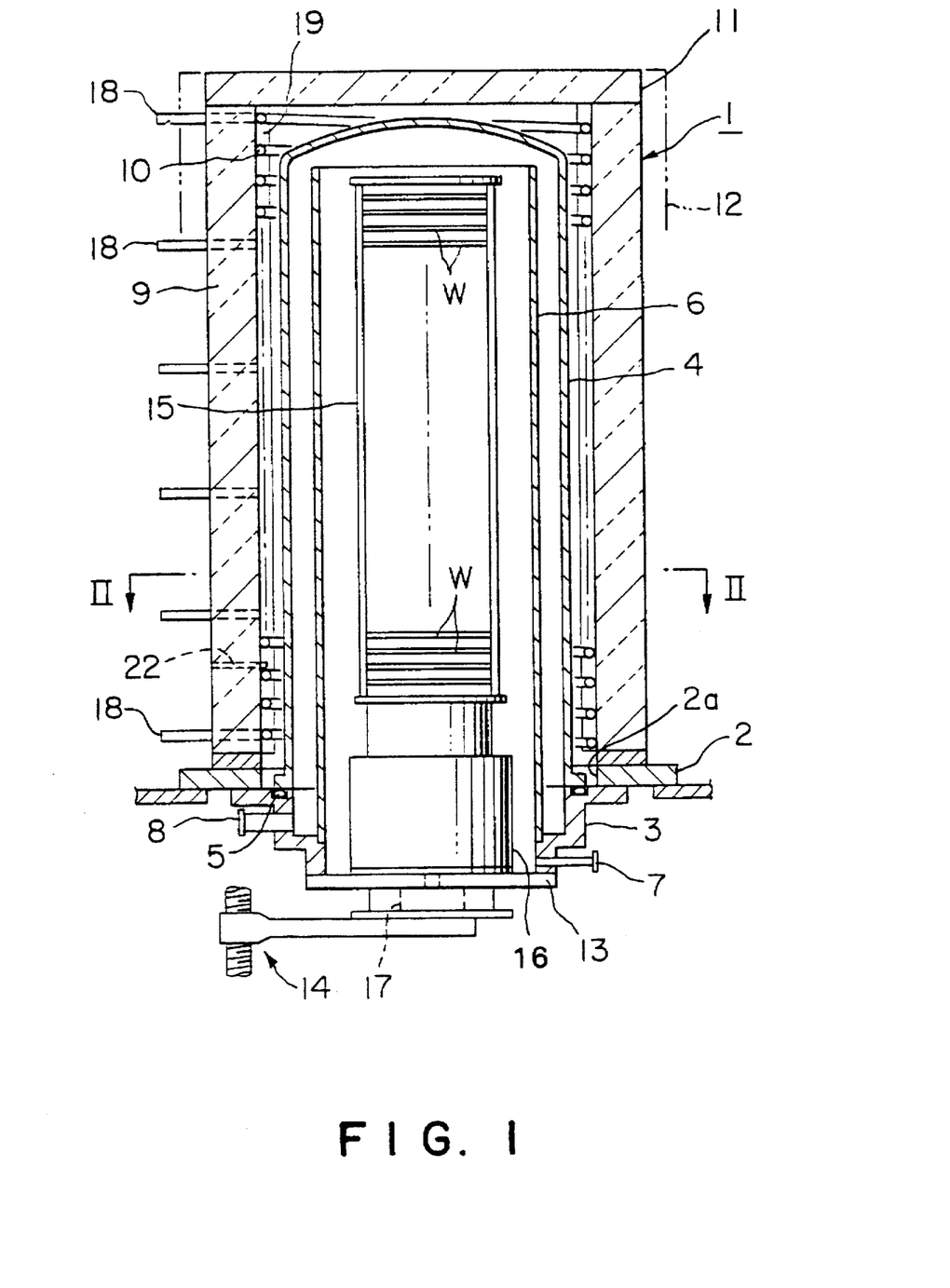
FIG. 1 is a vertical cross-sectional view of the entire configuration of an embodiment of the vertical heat treatment apparatus of the present invention.
Figure 2:
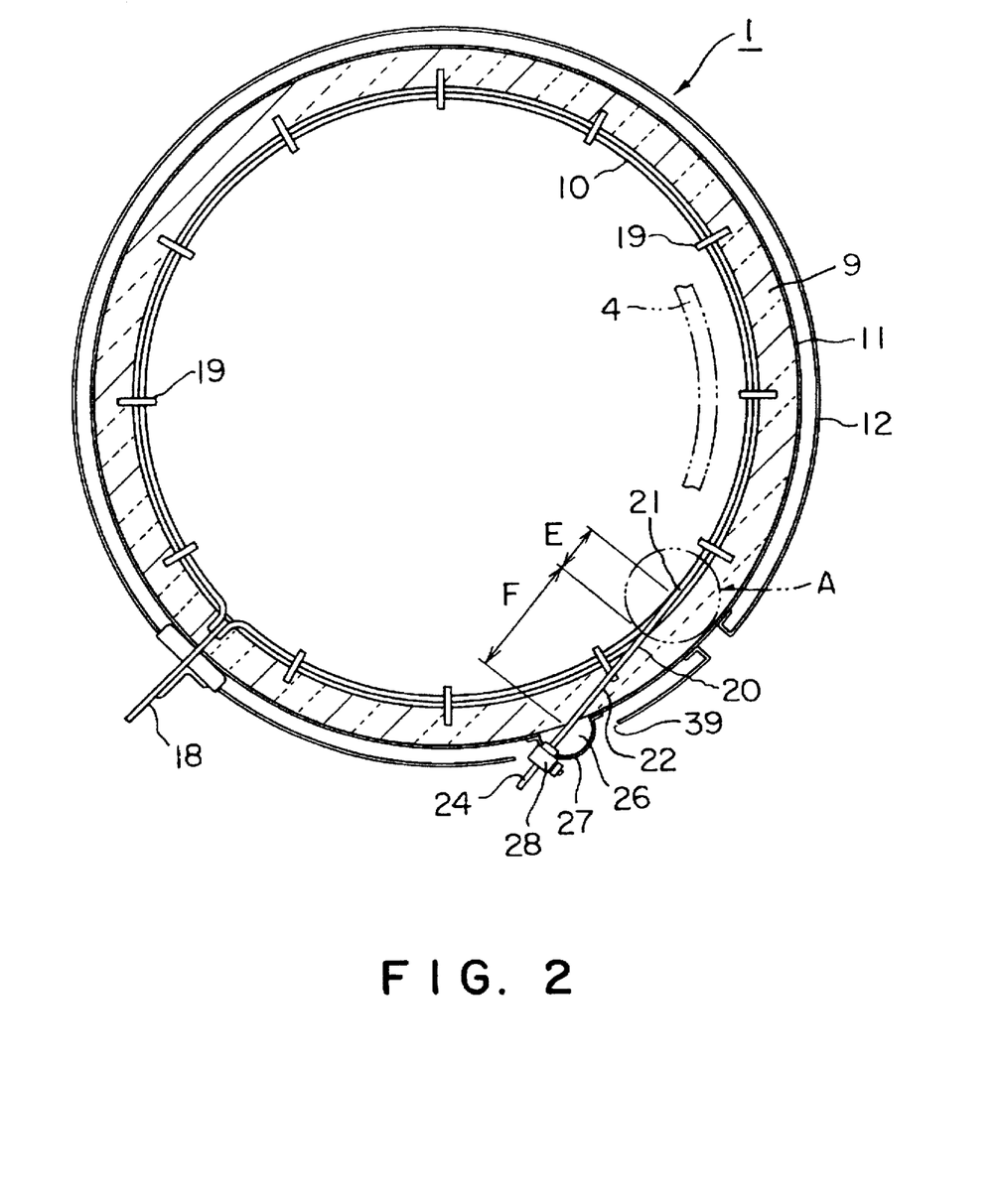
FIG. 2 is a horizontal cross-section taken along the line II—II of the vertical heat treatment apparatus of FIG. 1.

A preferred embodiment of the vertical heat treatment apparatus of the present invention will be described below with reference to the accompanying drawings. In FIGS. 1 and 2, reference number 1 denotes a vertical heat treatment apparatus 1 that is configured to subject semiconductor wafers, which are the objects to be processed, to a film formation process by reduced-pressure CVD. This vertical heat treatment apparatus 1 is provided with a horizontal base plate 2 of a material such as stainless steel and having a circular opening portion 2a, as shown in FIG. 1.

A short, cylindrical manifold 3 that is made of a heat-resistant metal such as stainless steel is attached in a freely removable manner by bolts to a lower portion of this base plate 2 so that it is coaxial with the opening portion 2a. A process tube 4, which is made of a heat-resistant material such as quartz in a circular cylindrical shape with the upper end thereof closed to form a vertical processing chamber, is mounted above this manifold 3 with an O-ring 5 therebetween. The process tube 4 of this embodiment has a double-walled construction with an inner tube 6 of quartz that is open at both ends arranged concentrically within the process tube 4. However, it should be noted that this inner tube 6 could be omitted, or an equalizer tube made of a material such as silicon carbide (SiC) could be further arranged on the outer side of the process tube 4.

Within the manifold 3 are provided a plurality of inlet ports 7 for introducing a processing gas into the process tube 4 from a processing gas source (not shown) and an outlet port 8 through which the interior of the process tube 4 is evacuated by a pressure-reducing means (also not shown) to a degree of vacuum of, for example, 10 to $10^{-8}$ Torr. An insulating layer 9, which is made of a heat-resistant material such as ceramic fibers in a circular cylindrical shape with the upper end thereof closed, is provided around the periphery of the process tube 4. The above described resistance heating member 10 that functions as a heater to heat the interior of the process tube 4 to a high temperature of 800° C. to 1200° C. is provided around the inner periphery of this insulating layer 9. The outer periphery of the insulating layer 9 is covered with an outer shell 11 of a material such as stainless steel, a cooling jacket 12 (accommodating coolant pipes therein) is provided around the outer periphery of the outer shell 11, and the insulating layer 9 including the cooling jacket 12 is supported on the base plate 2.

A lid 13 of a material such as stainless steel that opens and closes an opening (furnace opening) in the lower surface of the manifold 3 is provided below the manifold 3 in such a manner that it can be freely raised and lowered by an elevator mechanism 14 that functions as a loading mechanism. A wafer boat 15 of a material such as quartz, which holds a large number (such as 150) of semiconductor wafers W in a horizontal state and evenly spaced in the vertical direction, is mounted in a freely rotatable manner on the lid 13 with a heat-retaining tube 16 therebetween. Note that the lid 13 is provided with a rotational mechanism 17 that rotatably drives the heat-retaining tube 16.

A material such as Kanthal wire, which is an alloy of iron (Fe), chrome (Cr), and aluminum (Al), is used for the resistance heating member 10 which has a diameter of 3.5 mm in this embodiment, although this can vary depending on the type of furnace. The resistance heating member 10 is formed in a spiral shape of a predetermined pitch in the vertical direction along the inner wall of the insulating layer 9, as shown in FIG. 1. Terminal plates 18 for electrical connections are provided for this spiral-shaped resistance heating member 10 at suitable spacing in the axial direction of the insulating layer 9, passing through the insulating layer 9 and protruding to the outside thereof. Thus the configuration is such that the interior of the furnace of the heat treatment apparatus 1 can be divided into a plurality of zones, such as five zones, in the vertical direction, and the temperature within each of these zones can be controlled independently by a control apparatus while these temperatures, measured by temperature measuring elements that will be described later, are fed back thereto.

Figure 6:
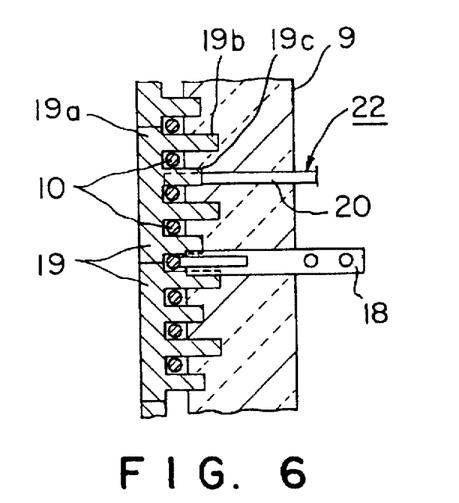
FIG. 6 is an expanded partial cross-sectional view of an insulating layer portion through which the temperature measuring element is inserted.

The resistance heating member 10 is mounted at a predetermined spacing from the inner wall of the insulating layer 9 by support members (separators) 19. These support members 19 are formed of a material that is thermally and electrically insulating, such as ceramic, and are arranged along the axial direction of the inner wall of the insulating layer 9 and also at a suitable radial spacing around the periphery thereof. Each of these support members 19 is divided into a plurality of sections in the axial direction of the insulating layer 9, as shown in FIG. 6. Each section of these support members 19 is configured in a comb shape, with a plurality of support pieces 19b and 19c (in this embodiment there are four each) protruding in the radially direction at a predetermined pitch that matches that of the resistance heating member 10 from a base portion 19a that carries the resistance heating member 10 on an inner side thereof. To ensure support strength when tip portions of the support pieces 19b and 19c are embedded in the insulating layer 9, longer support pieces 19b and shorter support pieces 19c are formed alternately in such a manner that adjacent support pieces have different lengths. Protrusions that are not shown in the figure are also formed in the tip portions of the longer support pieces 19b to prevent them from being removed from the insulating layer 9.

To ensure the maximum lifetime for the resistance heating member 10 made of Kanthal wire in an oxidizing or neutral gas environment, it is usually used after it has been pre-heated to 1050° C. for 7 to 8 hours so that an effective oxide film has formed thereon. That is why it is absolutely forbidden in the prior art to allow other components such as the temperature measuring elements to come into contact with the thus-formed effective oxide film.

Figure 3:
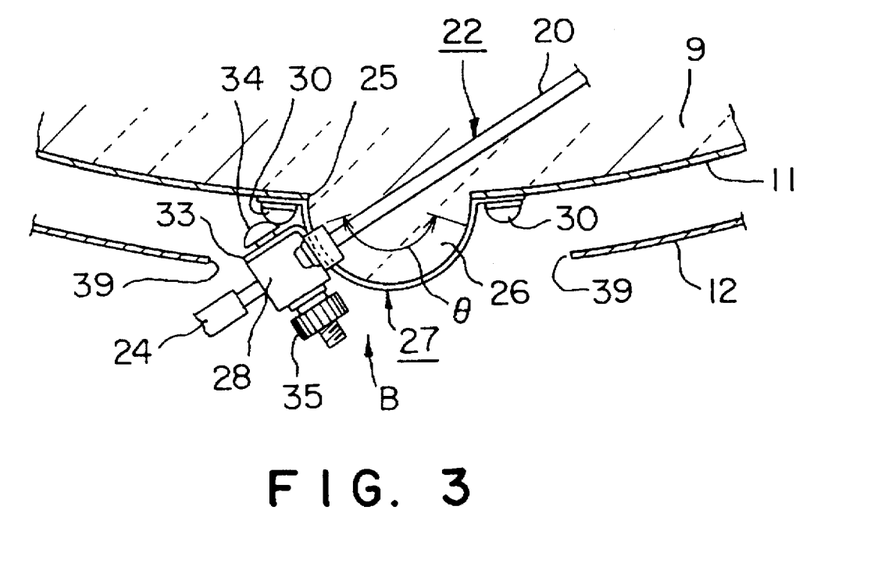
FIG. 3 is a partial expanded cross-sectional view of the portion of the temperature measuring element indicated by the arrow A in FIG. 2.
Figure 5:
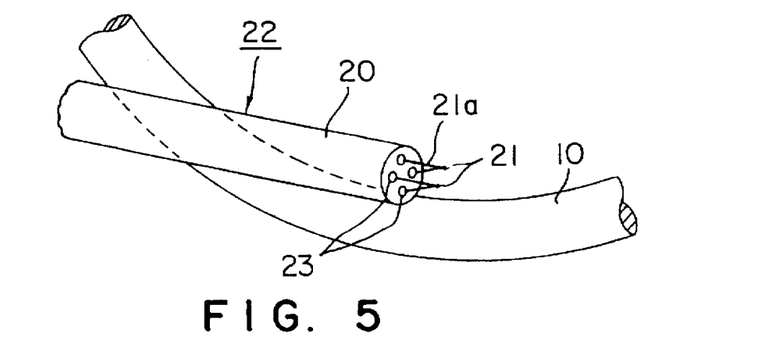
FIG. 5 is an expanded perspective view of the tip portion of the temperature measuring element aligned with the resistance heater of FIG. 2.

To control the temperature of the resistance heating member 10, a temperature measuring element 22 having a thermocouple 21 at the tip of an electrically insulated protective tube 20 (which is made of a material that is thermally and electrically insulating such as an alumina ceramic) is inserted into the insulating layer 9 from the outside. A temperature measuring element 22 is provided in each zone in such a manner that the tip portion thereof is aligned with or touches the resistance heating member 10. The insulated protective tube 20 is formed in a rod shape of a material such as alumina ceramic, and a plurality (four, in this embodiment) of through holes 23 are formed therein to allow the passage of thermocouple wires 21a, as shown in FIG. 5. In addition, two thermocouples 21 are provided exposed at the tip portion of the insulated protective tube 20. After the thermocouple wires 21a thereof have been passed through the through holes 23 in the insulated protective tube 20 and guided to a base portion thereof, they are connected to an input via a compensatory wire 24, as shown in FIG. 3. A tube of a circular cross-section with a diameter of 2.8 mm is used as the insulated protective tube 20 of this embodiment, but the cross-sectional shape and diameter are not limited in this way. The cross-sectional shape could equally well be oval or polygonal.

Figure 4:
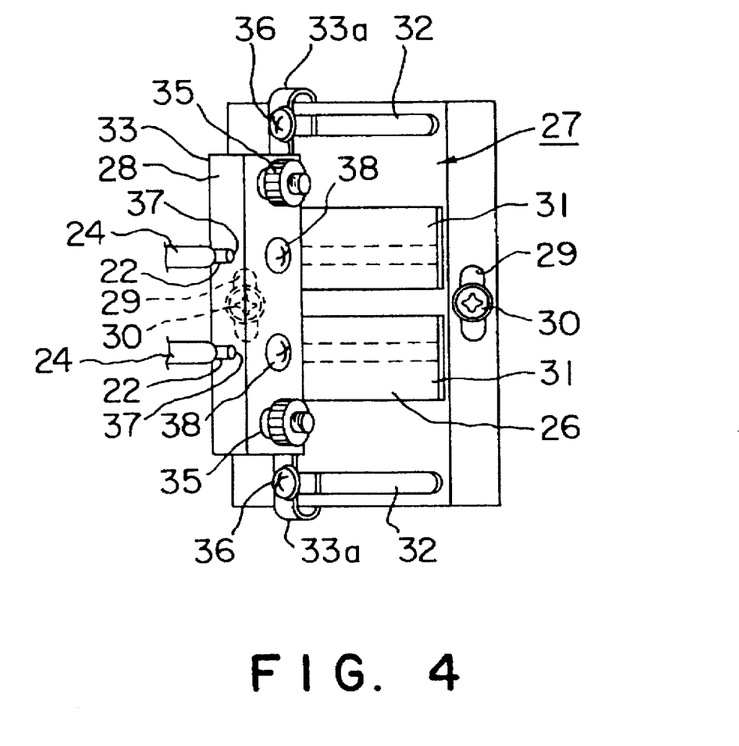
FIG. 4 is an expanded side view of the temperature measuring element of FIG. 3 as seen from the direction of the arrow B.

Each of the thus-configured temperature measuring elements 22 is inserted at an angle through the insulating layer 9 from the direction of connection wires of the resistance heating member 10, with the tip end thereof aligned in the longitudinal direction along the upper or lower surface of the resistance heating member 10, or in contact therewith, and the tip portion thereof (the portion of the insulated protective tube 20 excluding the thermocouples 21) is placed into contact with the resistance heating member 10. To attach this temperature measuring element 22, opening portions 25 are formed in the outer shell 11 covering the outside of the insulating layer 9, and an arch-shaped guide member 27 of a material such as stainless steel and packed full of a thermal insulating material 26 such as ceramic fibers is provided in such a manner as to cover the opening portions 25, as shown in FIG. 3 or FIG. 4. This guide member 27 is arranged in such a manner that the angle of insertion of the base portion of the temperature measuring element 22 can be freely adjusted via a plastic holder member 28.

The guide member 27 has elongated slots 29 in the vertical direction on left and right sides thereof, and thus it can be attached to the outer surface of the outer shell 11 by bolts 30 passing through the elongated slots 29 in such a manner that the position thereof can be freely adjusted in the vertical direction. Two windows 31 are formed one above the other in the guide member 27 to correspond to the opening portions 25 in the outer shell 11, and horizontal guide slits 32 are formed along upper and lower edge portions of the guide member 27. The holder member 28 is formed as a rectangular block of a composite plastic, such as polyether ether ketone (PEEK) which has a comparative low thermal conductivity, and it is attached by bolts 34 and nuts 35 to a support plate 33 of an L-shaped cross-section in such a manner that it can be easily removed. The relative positioning of the resistance heating member 10 and the temperature measuring element 22 can be freely adjusted by this guide member 27, regardless of how the heat generated by the resistance heating member 10 distorts the configuration in the circumferential, radial, or vertical direction.

The support plate 33 has an arm 33a of a U-shaped cross-section embracing each of the upper and lower edge portions of the guide member 27. These arms 33a are fastened to the upper and lower edge portions of the guide member 27 by bolts 36 through the guide slits 32 so that the support plate 33 can be freely adjusted through a predetermined range θ by horizontal movement thereof. Two axial holes 37 are formed in the holder member 28 to correspond to the windows 31, to allow the base portions of the temperature measuring elements 22 to pass therethrough substantially horizontally. The base portion of each of the temperature measuring elements 22 passing through one of these axial holes 37 is fixed by a fastening screw 38. Note that a cutout portion 39 is provided in the cooling jacket 12 to ensure that the guide member 27 and the holder member 28 do not interfere with the cooling jacket 12. The temperature measuring elements 22 are also arranged in such a manner that they are inserted in the vicinity of the shorter support pieces 19c, to prevent them interfering with the support members 19 of the resistance heating member 10.

With the vertical heat treatment apparatus 1 of this invention as configured above, each temperature measuring element 22 having a thermocouple 21 in a tip portion of an insulated protective tube 20 both penetrates the insulating layer 9 from the outside at an angle in the direction in which the coiled resistance heating member 10 is connected, and also rests with the tip portion of the temperature measuring element 22 either aligned with the resistance heating member 10 or in contact therewith. This makes it possible to control the heat radiated from the temperature measuring element 22 and also reduces any temperature error between the resistance heating member 10 and the temperature measuring element 22. Thus the measurement precision of the temperature measuring element 22 is improved, as well as the response rate and reproducibility thereof, enabling accurate and easy management of temperature within the vertical heat treatment apparatus 1.

In other words, it is possible to form a range E over which the tip portion of the temperature measuring element 22 and the resistance heating member 10 are overlapped and a wider range F in which the temperature measuring element 22 is thermally insulated by the insulating layer 9, by positioning the temperature measuring element 22 so that it is inserted at an angle through the insulating layer 9 from the direction in which the resistance heating member 10 is connected, as shown in FIG. 2. As a result, the heat radiated from the temperature measuring element 22 can be sufficiently suppressed and also the temperature error between the resistance heating member 10 and the temperature measuring element 22 can be reduced. Since the radius of the temperature measuring element 22 can be made as small as 2.8 mm, the response thereof is further improved.

Since the tip portion of the insulated protective tube 20 is in contact with the resistance heating member 10, it is expected that not only will the measurement precision be improved, but also the response rate and reproducibility thereof. In addition, the opening portion 25 is formed in the outer shell 11 that covers the insulating layer 9 and the arch-shaped guide member 27 filled with the thermal insulating material 26 is provided to cover this opening portion 25. The base end portion of the temperature measuring element 22 is provided in this guide member 27 in such a manner that the angle thereof can be freely adjusted by the holder member 28 made of PEEK which has a low thermal conductivity. Therefore, the heat radiated from the base end of the temperature measuring element 22 can be further suppressed and it is also possible to easily adjust the angle of the temperature measuring element 22 when it is positioned either aligned with the resistance heating member 10 or in contact therewith.

It should be noted that the vertical heat treatment apparatus of the present invention is not limited to the above described embodiment; it can be modified in various different ways within the scope of the accompanying claims. For example, although the resistance heating member 10 of this embodiment was specified as being a wire-shaped heater, it is not limited thereto and could equally well be a flat strip or a coil. In addition, the resistance heating member 10 need not necessarily be formed in a spiral shape along the peripheral direction of the inner wall of the insulating layer 9; it could be formed in a zigzag shape that reciprocates in the axial direction of the inner wall of the insulating layer 9 while extending in the peripheral direction.

It is also not absolutely necessary for the tip portion of the temperature measuring element 22 to be in contact with the resistance heating member 10; it could be placed not in contact therewith, provided that it is aligned in the vicinity of the resistance heating member 10. The objects to be subjected to thermal treatment by the vertical heat treatment apparatus to which this invention is applied are not limited to semiconductor wafers; this invention can be applied to other objects such as LCD substrates. The vertical heat treatment apparatus to which this invention is applied is not limited to a reduced-pressure CVD apparatus, it could be any apparatus that applies a process such as oxidation, diffusion, or annealing.

The superlative effects obtained by the present invention are discussed below.

With the vertical heat treatment apparatus of this invention, since the temperature measuring element, which has a thermocouple in a tip portion of an insulated protective tube, is inserted from the outside of the insulating layer and also the tip portion of the temperature measuring element is either aligned with the resistance heating member or is place in contact therewith, the heat radiated from the temperature measuring element can be suppressed and also any temperature error between the resistance heating member and the temperature measuring element can be reduced. This is intended to improve the measurement precision of the temperature measuring element as well as improve the response rate and reproducibility thereof, thus facilitating temperature management in the vertical heat treatment apparatus.

Since the tip portion of the insulated protective tube of the vertical heat treatment apparatus of this invention is either aligned in the vicinity of the resistance heating member, or in contact therewith, not only the measurement precision thereof but also the response rate and reproducibility thereof are further improved.

Since the vertical heat treatment apparatus of this invention is configured in such a manner that an opening portion is formed in an outer shell covering the outer periphery of the insulating layer and an arch-shaped guide member filled with a thermal insulating material is provided to cover the opening portion, and since the guide member is provided in such a manner that the angle of the base portion of the temperature measuring element can be freely adjusted via the plastic holder member, the heat radiated from the temperature measuring element can be further suppressed and also it is easy to adjust the angle of the temperature measuring element when it is positioned to be aligned with the resistance heating member.

What is claimed is:

1. A vertical heat treatment apparatus, comprising:
   a cylindrical insulating layer surrounding a periphery of a vertical processing chamber accommodating objects to be subjected to thermal processing, and
   a resistance heating member provided along an inner periphery of said insulating layer; and
   said vertical heat treatment apparatus further comprising,
   a temperature measuring element having a thermocouple in a tip portion of an insulated protective tube to monitor the temperature of said resistance heating member, wherein said temperature measuring element is inserted such that an acute angle is formed between said temperature measuring element and an intersecting tangential line extending off said insulating layer and lying, with respect to said temperature measuring element, on a common cross-sectional plane of said insulating layer, and said temperature measuring element is inserted in said furnace from the outside of said insulating layer and into said insulating layer, and a tip portion of said temperature measuring element is aligned with said resistance heating member so as to extend in tangential fashion with respect to said resistance heating member.

2. The vertical heat treatment apparatus according to claim 1, wherein said tip portion of said insulated protective tube is placed in contact with said resistance heating member.

3. The vertical heat treatment apparatus according to claim 1, wherein an opening portion is formed in an outer shell covering the outer periphery of said insulating layer and an arch-shaped guide member filled with a thermal insulating material is provided in such a manner as to cover said opening portion, and wherein a base portion of said temperature measuring element is provided in said guide member with a plastic holder member therebetween in such a manner that the angle of insertion thereof can be freely adjusted.

4. The vertical heat treatment apparatus according to claim 1, wherein an opening portion is formed in an outer shell covering the outer periphery of said insulating layer and an arch-shaped guide member filled with a thermal insulating material is provided in such a manner as to cover said opening portion, and wherein an elongated slot is formed in the vertical direction in each side portion of said guide member so that the position of said temperature measuring element can be freely adjusted in the vertical direction with respect to said resistance heating member.

5. A heat treatment apparatus, comprising:
   a processing chamber for accommodating objects to be subjected to thermal processing;
   an insulating layer surrounding a periphery of the vertical processing chamber;
   a cylindrically arranged resistance heating member provided along a periphery of said insulating layer;
   a temperature measuring element having a tip portion positioned for sensing the temperature of said resistance heating member, wherein said temperature measuring element extends through said processing chamber and into said insulating layer such that said tip portion is aligned with said resistance heating member, and a central axis of said temperature measuring element, extending through the tip portion thereof, extends in a non-radial direction along a sectional plane of said insulating layer and is aligned in tangential relationship to said heating member.

6. A heat treatment apparatus as recited in claim 5, further comprising an outer shell encompassing said insulating layer, a guide member supported by said outer shell, and a support assembly for said temperature measuring element, said guide member including an arch shaped slot within which said temperature measuring element support assembly slides to have said temperature measuring assembly assume a different angle on said sectional plane.

7. A heat treatment apparatus as recited in claim 6, wherein said temperature measuring element includes a thermocouple supported by an insulating outer cover, and said temperature measuring element support assembly includes a plastic block through which said insulating outer cover extends.

8. A heat treatment apparatus as recited in claim 7, wherein said guide member includes a vertical temperature expansion slot and has an inner cavity filled with insulating material.

9. A heat treatment apparatus as recited in claim 5, wherein said tip portion is in direct contact with said resistance heating element.

10. A heat treatment apparatus as recited in claim 9, wherein said resistance heating element is in a spiral shape, and said heat treatment apparatus includes a plurality of temperature measuring elements spaced vertically along said spiral shaped heating element.

11. A heat treatment apparatus as recited in claim 5, wherein said resistance heating element is in a spiral shape and the tip portion of said temperature measuring element extends so as to be at least partially between an inner and outer cylinder lying flush on a respective inner and outer periphery of said spiral shape resistance heating element.

12. A heat treatment apparatus as recited in claim 11, wherein said tip portion comprises an insulated protective tube and a thermocouple and comes in direct contact with said spiral shape resistance heating element.

13. The heat treatment apparatus according to claim 5, wherein an opening portion is formed in an outer shell covering the outer periphery of said insulating layer and an arch-shaped guide member filled with a thermal insulating material is provided in such a manner as to cover said opening portion, and wherein a base portion of said temperature measuring element is provided in said guide member with a plastic holder member therebetween in such a manner that the angle of insertion thereof can be freely adjusted.

14. The heat treatment apparatus according to claim 5, wherein an opening portion is formed in an outer shell covering the outer periphery of said insulating layer and an arch-shaped guide member filled with a thermal insulating material is provided in such a manner as to cover said opening portion, and wherein an elongated slot is formed in the vertical direction in each side portion of said guide member so that the position of said temperature measuring element can be freely adjusted in the vertical direction with respect to said resistance heating member.

15. A vertical heat treatment apparatus, comprising:

a vertical processing chamber for accommodating objects to be subjected to thermal processing;

an insulating layer extending about an outer periphery of the vertical processing chamber;

a resistance heating member extending about said processing chamber and positioned so as to be insulated by said insulating layer;

a temperature measuring device positioned to monitor the temperature of said resistance heating member;

an outer furnace shell encompassing said insulating layer;

an arch-shaped guide member filled with insulation and covering an opening in said outer furnace shell such that a base portion of said temperature measuring device is adjustable to vary an angle of insertion of said temperature measuring device.

16. A vertical heat treatment apparatus, comprising:

a vertical processing chamber for accommodating objects to be subjected to thermal processing;

an insulating layer extending about an outer periphery of the vertical processing chamber;

a resistance heating member extending into said insulating layer;

a temperature measuring device positioned to monitor the temperature of said resistance heating member;

an outer furnace shell encompassing said insulating layer;

an arch-shaped guide member which slidingly supports said temperature measuring device and includes vertical slots so as to provide for vertical adjustment of said temperature measuring device.

17. A vertical heat treatment apparatus as recited in claim 1, wherein a central axis of said temperature measuring element is oriented so as to be in a non-parallel relationship with any diametrical line lying on said plane and intersecting the central axis of said cylindrical insulating layer.

18. A vertical heat treatment apparatus as recited in claim 1, wherein said resistance heating element includes coils and at least a portion of said tip portion extends to a location between an inner and outer cylinder lying flush on a respective inner and outer periphery of said resistance heating element coils.

19. A vertical heat treatment apparatus as recited in claim 18, wherein said tip portion contacts said heating resistance element coils.

\* \* \* \* \*